United States Patent
Reich et al.

[11] Patent Number: 5,900,340
[45] Date of Patent: May 4, 1999

[54] ONE DIMENSIONAL LITHOGRAPHIC PROXIMITY CORRECTION USING DRC SHAPE FUNCTIONS

[75] Inventors: Alfred J. Reich; Kevin D. Lucas; Michael E. Kling; Warren D. Grobman; Bernard J. Roman, all of Austin, Tex.

[73] Assignee: Motorola, Inc., Schaumburg, Ill.

[21] Appl. No.: 08/805,863

[22] Filed: Mar. 3, 1997

[51] Int. Cl.$^6$ .................................................... G03F 9/00
[52] U.S. Cl. ................................................ 430/22; 430/5
[58] Field of Search ............................................ 430/5, 22

[56] References Cited

U.S. PATENT DOCUMENTS

| | | | |
|---|---|---|---|
| 4,595,295 | 6/1986 | Wilczynski | 356/401 |
| 4,636,626 | 1/1987 | Hazama et al. | 250/201 |
| 4,895,780 | 1/1990 | Nissan-Cohen et al. | 430/5 |
| 5,208,124 | 5/1993 | Sporon-Fiedler et al. | 430/5 |
| 5,242,770 | 9/1993 | Chen et al. | 430/5 |
| 5,447,810 | 9/1995 | Chen et al. | 430/5 |
| 5,546,225 | 8/1996 | Shiraishi | 359/559 |
| 5,636,002 | 6/1997 | Garofalo | 355/53 |
| 5,705,301 | 1/1998 | Garza et al. | 430/5 |

OTHER PUBLICATIONS

BACUS News, "Evaluation of a fast and flexible OPC Package: OPTISSMO", Society of Photo–Optical Instrumentation Engineers, vol. 13, Issue 1, pp. 3 & 5–8, Jan. (1997).

Primary Examiner—Nam Nguyen
Assistant Examiner—Steven H. VerSteeg
Attorney, Agent, or Firm—Daniel D. HIll

[57] ABSTRACT

Integrated circuit designs are continually shrinking in size. Lithographic processes are used to pattern these designs onto a semiconductor substrate. These processes typically require that the wavelength of exposure used during printing be significantly shorter than the smallest dimension of the elements within the circuit design. When this is not the case, the exposure radiation behaves more like a wave than a particle. Additionally, mask manufacturing, photoresist chemical diffusion and etch effects cause pattern transfer distortions. The result is that circuit elements do not print as designed. To counter this effect the designs themselves can be altered so that the final printed results better match the initial desired design. The process of altering designs in this way is called Lithographic Proximity Correction (LPC). Edge assist shapes and edge biasing features are added to integrated circuit designs by shape manipulation functions to perform one dimensional (1-D) LPC.

14 Claims, 9 Drawing Sheets

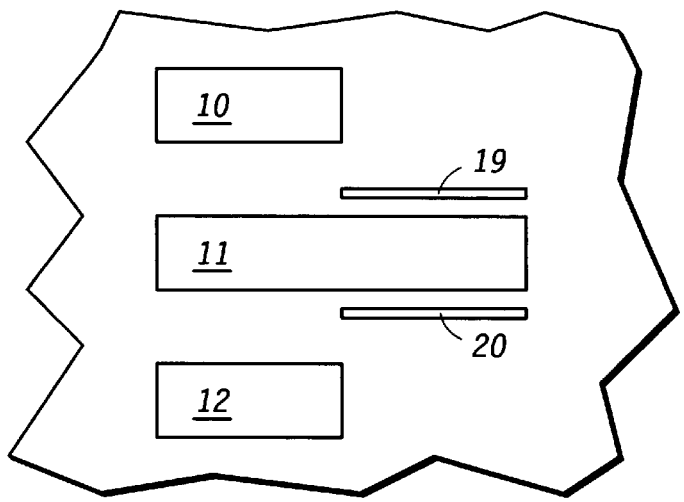
*FIG.4*
—PRIOR ART—
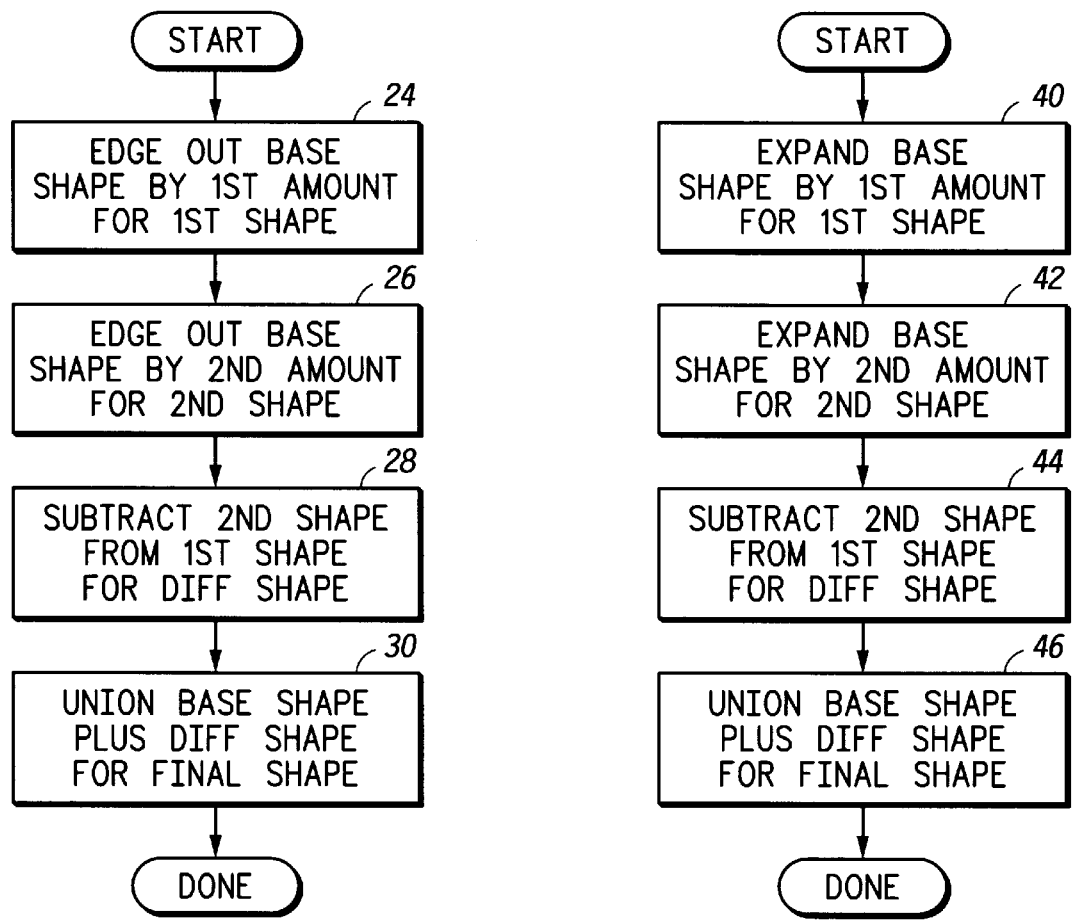
*FIG.5*  *FIG.7*

ONE DIMENSIONAL LITHOGRAPHIC PROXIMITY CORRECTION USING DRC SHAPE FUNCTIONS

CROSS REFERENCE TO RELATED APPLICATION

This application is related to our patent application entitled "TWO DIMENSIONAL LITHOGRAPHIC PROXIMITY CORRECTION USING DRC SHAPE FUNCTIONS", by Alfred J. Reich et al., having Ser. No. 08/810,561, filed on Mar. 3, 1997, and assigned to the assignee hereof.

FIELD OF THE INVENTION

The present invention generally relates to Very Large Scale Integrated (VLSI) lithography mask design, and more specifically to one dimensional proximity correction of VLSI design databases using Design Rule Checking (DRC) shape functions.

BACKGROUND OF THE INVENTION

The invention herein discloses algorithms for applying Lithographic Proximity Correction (LPC) to very large scale integrated (VLSI) circuit design databases to compensate for 1-dimensional (1-D) photolithographic errors.

Lithographic proximity correction (LPC) is used in very large scale integrated circuits to correct for printing errors such as one-dimensional lithographic errors. In integrated circuits having printed shapes with sizes that approach the wavelength of exposure, one-dimensional lithographic printing errors may occur because of electromagnetic diffraction from parallel edges of a mask feature during the lithographic printing process. For example, densely placed parallel transistor gates can be affected by this diffraction phenomenon differently from isolated transistor gates. Additionally, reticle, photoresist diffusion, and etch effects can cause 1-D lithographic printing errors. LPC is used to correct for these optical and non-optical undesirable printing errors, by adding or subtracting other features or shapes to or from the original design shape. The other features are used to modify the original design in order to compensate for certain undesirable effects that may take place during printing.

FIG. 1 and FIG. 2 together are used to illustrate a one-dimensional proximity effect. FIG. 1 illustrates original shapes 10, 11 and 12. Shapes 10, 11 and 12 are original design shapes positioned adjacent to each other, and separated by a certain minimum spacing. FIG. 2 illustrates original shapes 10, 11 and 12 as they would appear 10', 11' and 12' after printing due to one-dimensional lithographic proximity effects. The portion of shape 11' which is not located near another shape tends to be larger than that portion of 11' which is positioned between shapes 10' and 12'. These types of one-dimensional proximity effects adversely affect the effective gate length in an integrated circuit where shapes 10', 11' and 12' are formed from a polysilicon layer on top of a semiconductor substrate 13, and are used to create transistor gates.

FIG. 3 and FIG. 4 together illustrate features which may be used to correct or compensate for the one-dimensional proximity effects illustrated by FIG. 1 and FIG. 2. FIG. 3 illustrates the positioning of edge biases 14, 15, 16 and 17 with the edges of original shapes 10, 11 and 12 to increase the effective width of original shapes 10, 11 and 12 beyond the original designed dimensions in order to print at their original design dimensions. So, unlike the shape 11' illustrated in FIG. 2, shape 11 illustrated in FIG. 3 will have a uniform width throughout its length. FIG. 4. illustrates assist features for correcting one-dimensional proximity effects. In FIG. 4, a uniform width of shape 11 is provided by using subresolution assist features 19 and 20 to simulate an area of high density shapes without actually printing additional shapes. Assist features 19 and 20 are intentionally too narrow to print because they are substantially narrower than the resolution limit of a lithographic process.

Edge biasing features are generally used in areas where there are many closely spaced shapes. On the other hand, assist features are generally used in isolated areas.

BRIEF DESCRIPTION OF THE DRAWINGS

A better understanding of the present invention can be obtained when the following Detailed Description is considered in conjunction with the following drawings, in which:

FIG. 3 and FIG. 4 together illustrate features which may be used to correct or compensate for the one-dimensional proximity effects illustrated by FIG. 1 and FIG. 2;

FIG. 5 and FIG. 6 together illustrate a method for creating assist features in accordance with one embodiment of the present invention;

FIG. 7 and FIG. 8 together illustrate a method for generating assist features in accordance with a second embodiment of the present invention;

DETAILED DESCRIPTION

Figure 1:
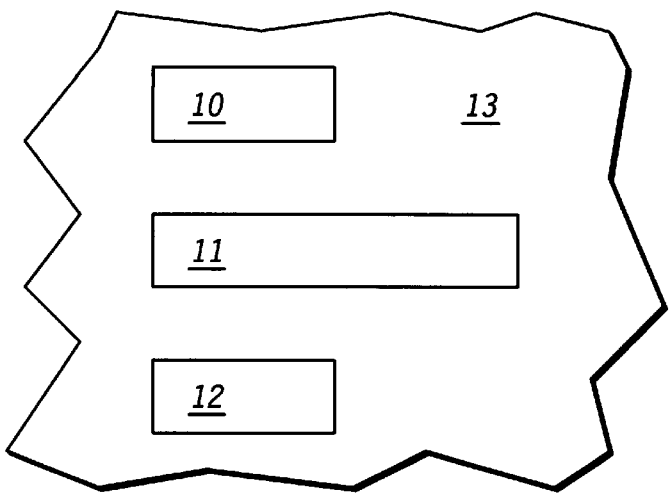
FIG. 1 and FIG. 2 together are used to illustrate a one-dimensional proximity effect.
Figure 2:
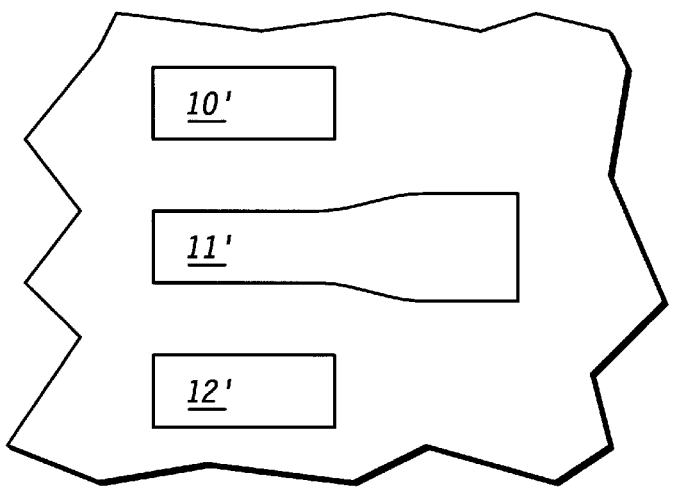
Figure 3:
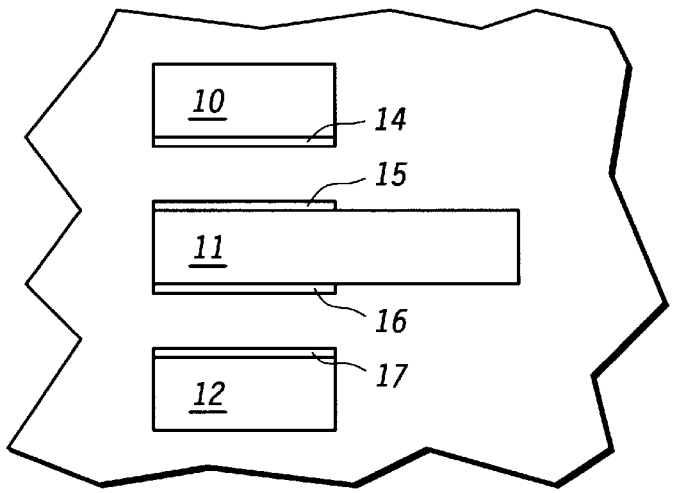

Generally the present invention provides a method for correcting certain lithographic printing errors in very large scale integrated circuits (VLSI). The method is implemented as software and operates on a physical design database. A physical design database specifies the geometries of electronic devices used as circuit elements in an integrated circuit, such as transistors, resistors, capacitors, etc.

The present invention includes algorithms that are described using operations similar to the high-level scripting languages used by existing Design Rule Checking (DRC) software. DRC software applications have been around for many years, and are not only stable and robust, but also very similar.

Most DRC software has the capability of generating shapes according to user specified rules. This capability is used to support the verification of layout design rules. In DRC applications such shapes are used as an intermediate step and are not intended to be printed or merged with the design database.

This approach to LPC uses the same shape generating capability, but leaves the shapes in the database. The rules for generating the LPC shapes (i.e., the algorithms of this invention) are written so that the resulting shapes will account for the lithographic transformations that will take place during printing.

Generally, the present invention provides a method for adding assist features to a semiconductor design to form an altered semiconductor design. The method comprises the steps of: performing a growing function on a base shape by a first amount to produce a first shape; performing the growing function on the base shape by a second amount to produce a second shape; subtracting the second shape from the first shape to produce a third shape; and unioning the base shape and the third shape to form a final shape. The growing function may an edge-out function that moves each edge of the base shape outward a fixed amount in a direction such that it remains parallel to each original edge of the base shape.

The growing function may be an expansion function that moves vertices of the base shape outward a fixed amount along all lines bisecting each original vertice of the base shape. A lithographic reticle may be produced utilizing the method above by forming reflecting or opaquing bodies on the lithographic reticle corresponding to the altered semiconductor design. The lithographic reticle corresponding to the altered semiconductor design may be used to create a pattern on a semiconductor device.

Integrated circuits may be fabricated utilizing the above method by generating an altered semiconductor design file containing the final shape; creating a set of one or more lithographic masks from the altered semiconductor design file; and fabricating a plurality of integrated circuits from the set of one or more lithographic masks.

A method of applying edge biasing correction to a semiconductor design to compensate for proximity effects to form an altered semiconductor design comprises the steps of: defining a maximum distance separating a plurality of original design shapes for applying an edge biasing correction; producing a space shape comprising a space between the plurality of original design shapes that falls below a maximum separating distance; performing a grow function on the plurality of original design shapes by a predetermined amount to produce an oversize shape; intersecting the space shape with the oversize shape to produce a biasing shape; and unioning the plurality of original design shapes with the biasing shape to form a final shape.

The above step of producing a space shape also comprises the substeps of: growing the plurality of original design shapes by half of the maximum separating distance to form a first grown shape; shrinking the first grown shape by half of the maximum separating distance to form a second grown shape; and subtracting the plurality of original design shapes from the second grown shape to form the space shape. A lithographic reticle can be used to implement this method by forming reflecting or opaquing bodies on the lithographic reticle corresponding to the altered semiconductor design to create a pattern on a semiconductor device. A design file may be generated for fabricating an integrated circuit using an altered semiconductor design file containing the final shape. A set of one or more lithographic masks from the altered semiconductor design file may be created. A plurality of integrated circuits from the set of one or more lithographic masks may be fabricated.

A method of applying edge biasing correction to a semiconductor design to compensate for proximity effects to form an altered semiconductor design, comprises the steps of: defining a maximum distance separating a plurality of base shapes for applying the edge biasing correction; producing a space shape comprising a space between the plurality of base shapes that falls below a maximum separating distance; growing each edge of the space shape by a predetermined amount to create a grown space shape; intersecting the plurality of base shapes with the grown space shape to create an edge shape; growing each edge of the edge shape by a predetermined amount to create a grown edge shape; intersecting the space shape with the grown edge shape to provide a bias shape; and unioning the bias shape with the plurality of base shapes to form a final shape.

The step of producing the space shape may comprise the substeps of: growing the plurality of original design shapes by half of the maximum separating distance to form a first grown shape; shrinking the first grown shape by half of the maximum separating distance to form a second grown shape; and subtracting the plurality of original design shapes from the second grown shape to form the space shape.

Refer now to the drawings wherein depicted elements are not necessarily shown to scale and wherein like or similar elements are designated by the same reference numeral through the several views.

Figure 6:
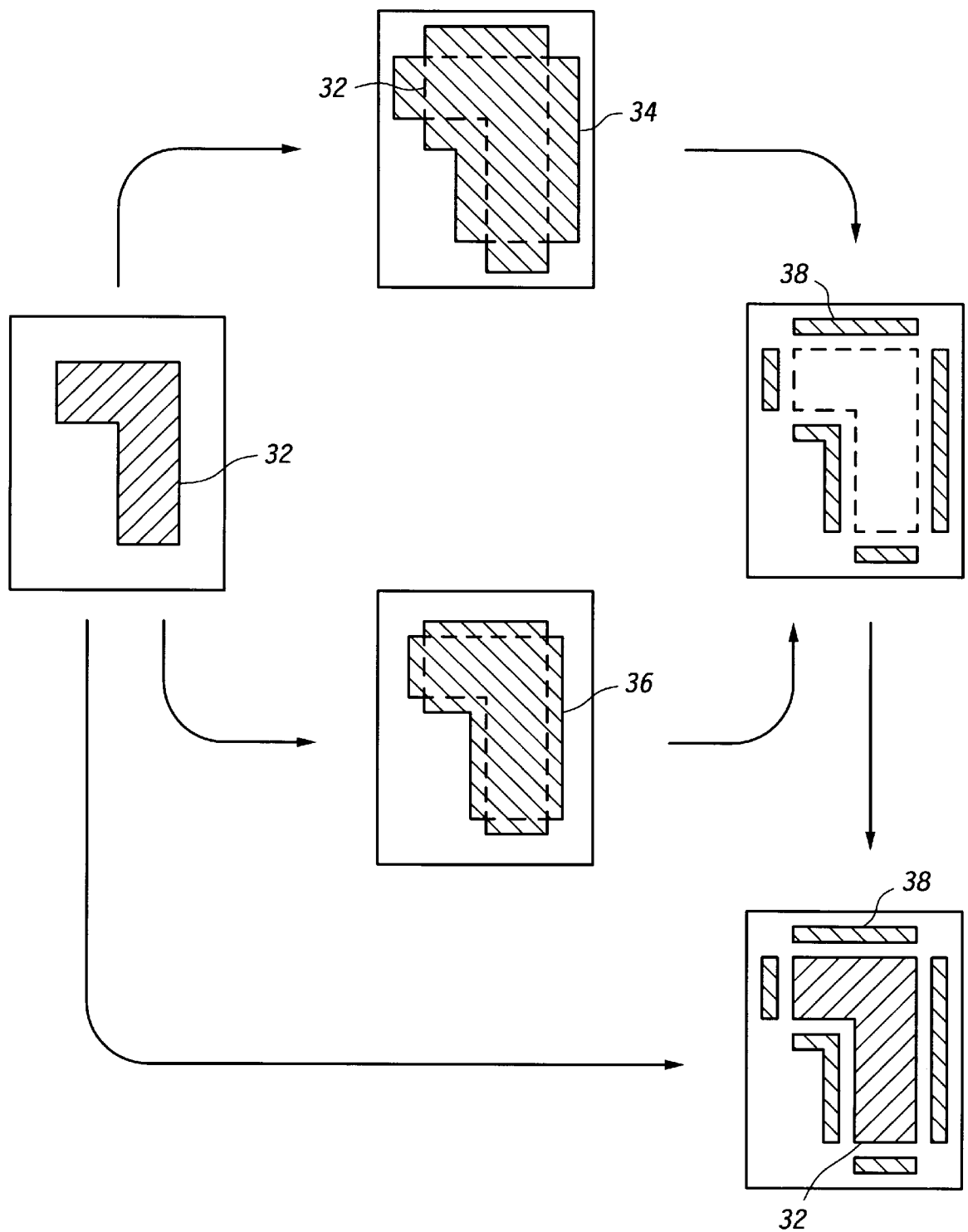

FIG. 5 is a flow chart that illustrates a method for creating assist features in accordance with one embodiment of the present invention. FIG. 6 is a portion of a circuit layout that illustrates the method for creating assist features illustrated in FIG. 5. Referring to both FIG. 5 and FIG. 6, starting at step 24, an original or base shape 32 is identified as a shape requiring assist features. In accordance with one embodiment, base shape 32 is formed on a semiconductor substrate in polysilicon. In other embodiments, base shape 32 may be formed in other materials, such as metal. The edges of base shape 32 are extended out by a predetermined amount to create an edge-expanded shape 34. Edge-expanded shape 34 is created by moving each edge of base shape 32 away from the interior of shape 32 without changing the length of the sides. This is followed by step 26 where the sides of shape 32 are edge-expanded by a second amount, to create an edge expanded shape 36, where the second amount is less than the amount in step 24. At step 28, the shape created in step 26 is subtracted from the shape created in step 24, resulting in the creation of assist features 38. At step 30, the union of assist features 38 with base shape 32 provide a final shape used for printing. As noted above, assist features 38 are narrower for the wave length of exposure used, and will not appear in the final printed circuit.

Figure 8:
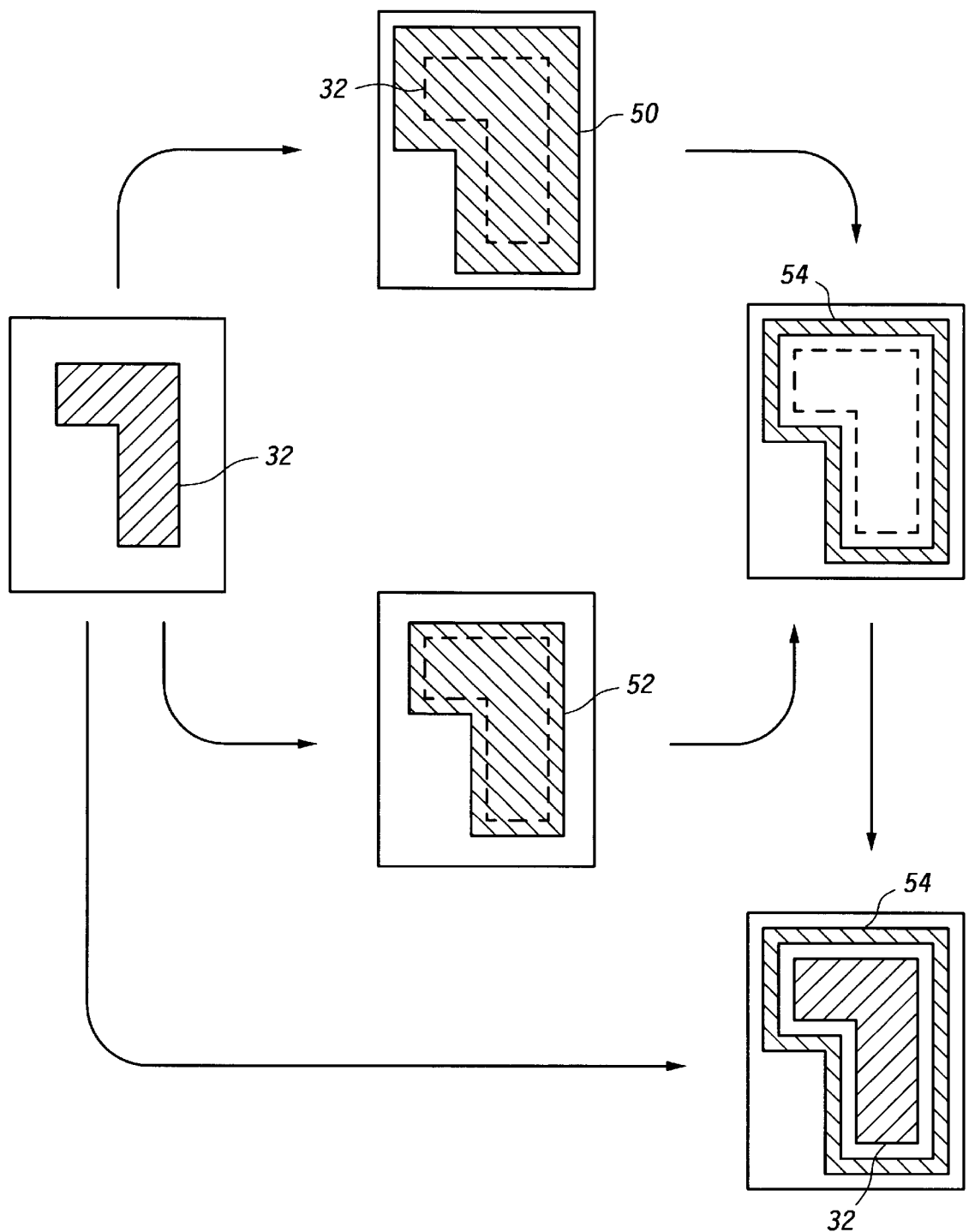

FIG. 7 is a flow chart that illustrates a method for generating assist features in accordance with a second embodiment of the present invention. FIG. 8 is a portion of a circuit layout that illustrates the method of FIG. 7. Referring to both FIG. 7 and FIG. 8 an original or base shape 32 is provided in which assist features are to be generated. Starting at step 40, the size of base shape 32 is expanded by a first predetermined amount to provide a expanded shape 50. Continuing at step 42, base shape 32 is expanded by a second amount to provide a second expanded shape 52 (illustrated in FIG. 8), and expanded shape 52 is smaller than expanded shape 50 in FIG. 8. Next at step 44, expanded shape 52 is subtracted from expanded shape 50 to provide a continuous assist feature 54 around base shape 48. Finally at step 46, a union of base shape 32 with assist feature 54 provides a final shape for printing. However, as in the discussion above, the width of assist feature 54 is less than the resolution limit and only base shape 32 will be printed.

Figure 9:
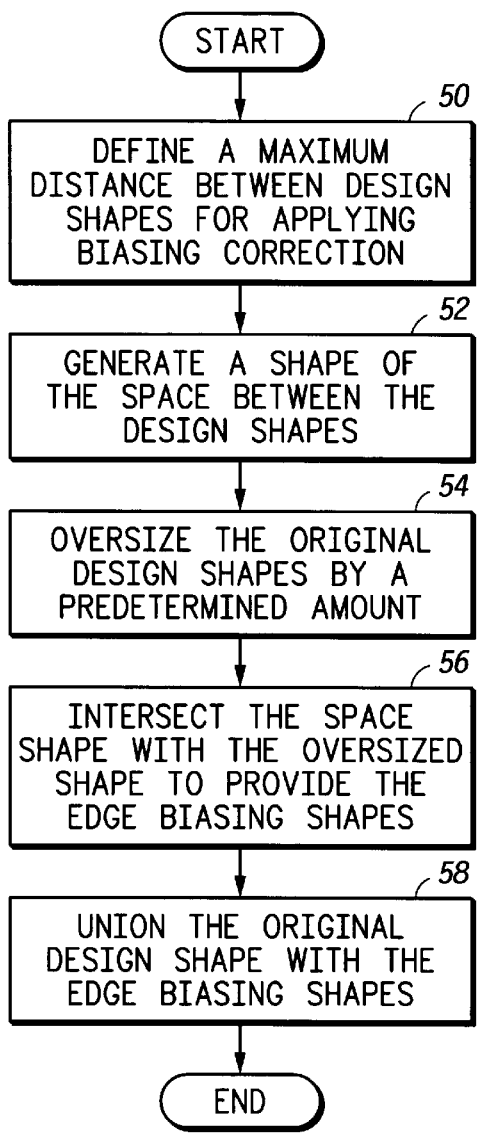
FIG. 9 and FIG. 10 together illustrate a method for generating edge biasing shapes in accordance with one embodiment of the present invention.
Figure 10:
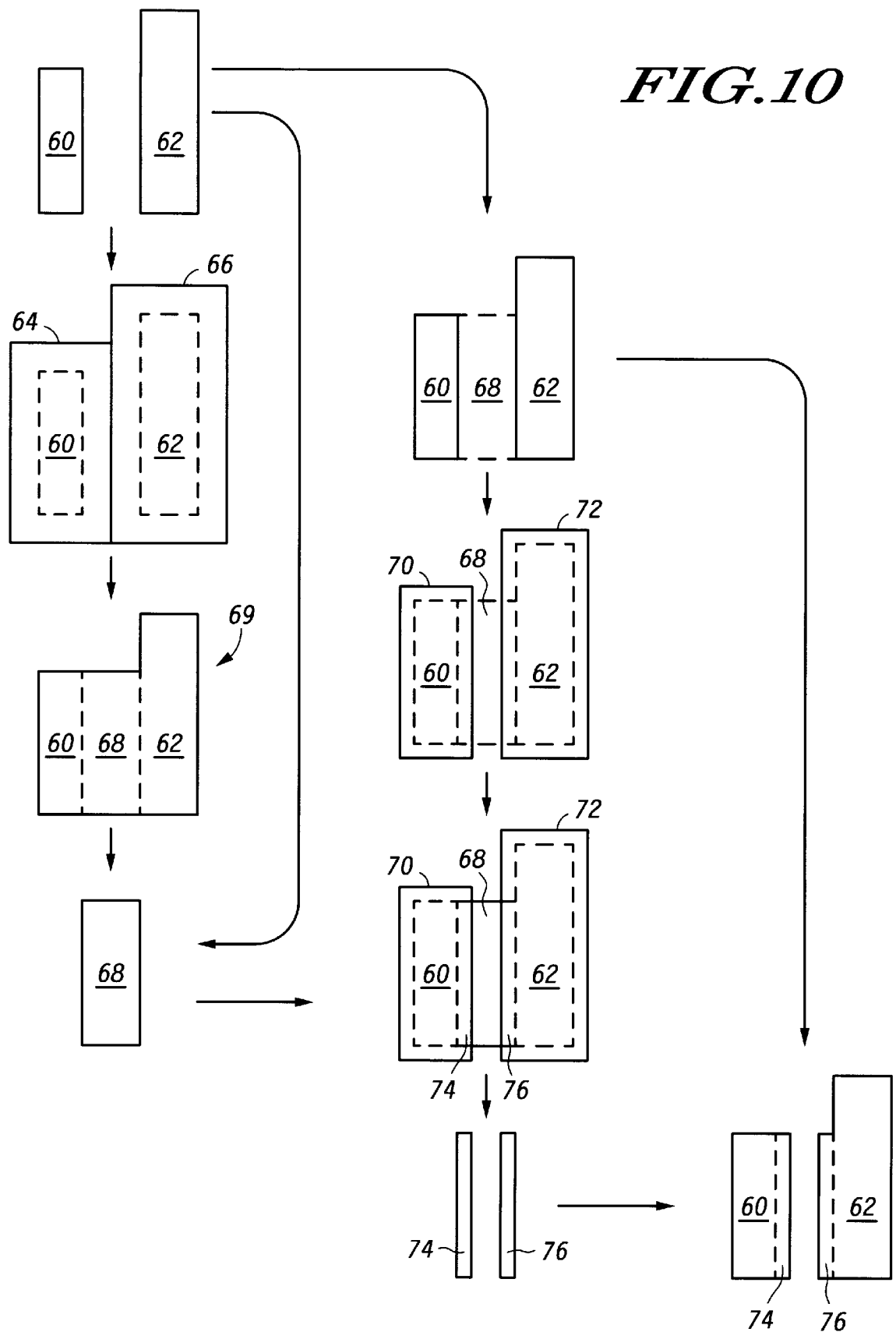

FIG. 9 is a flow chart that illustrates a method for generating edge biasing shapes in accordance with one embodiment of the present invention. FIG. 10 is a portion of a circuit layout that illustrates the method illustrated in FIG. 9. Referring to both FIG. 9 and FIG. 10, starting at step 50, a predetermined distance between shapes is chosen for selecting which features edge biasing correction is to be applied. For adjacent features separated by less than the predetermined amount, such as features 60 and 62 in FIG. 10, a shape of space between original features 60 and 62 is generated as illustrated in step 52. FIG. 10 illustrates one method for generating a shape of the space 68 between original features 60 and 62. Referring to FIG. 10, original design shapes 60 and 62 are oversized by one-half of the distance between adjacent edges of shapes 60 and 62. Expanded shape 64 is an oversized version of shape 60 and expanded shape 66 is an oversized version of 62. Expanded shapes 64 and 66 abut each other and are merged into a single polygon. The polygon is then undersized by an amount equal to the amount that original design shapes 60 and 62 were oversized to create another polygon 69. Original design shapes 60 and 62 then are subtracted from polygon 69 leaving space 68. Note that the above illustrates only one method for creating space 68 and those skilled in the art would recognize that space 68 may be created by various other techniques.

Continuing at step 54, original design shapes 60 and 62 are oversized by a predetermined amount to create oversized shapes 70 and 72. Next at step 56, space shape 68 is intersected with oversized shapes 70 and 72 to provide edge biasing shapes 74 and 76 as illustrated in FIG. 10. Finally at step 58, original design shapes 60 and 62 are unioned with edge biasing shapes 74 and 76. Edge biasing shapes 74 and 76 correct one-dimensional lithographic proximity effects as discussed above.

Figure 11:
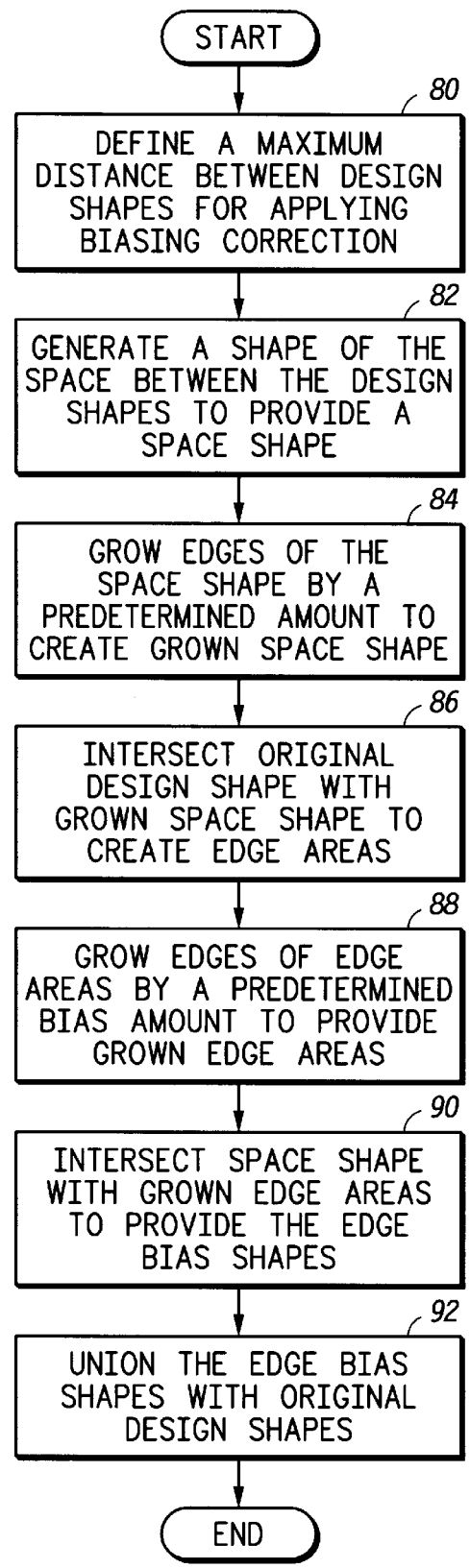
FIG. 11 and FIG. 12 together illustrate a method for generating edge bias shapes in accordance with another embodiment of the present invention.
Figure 12:
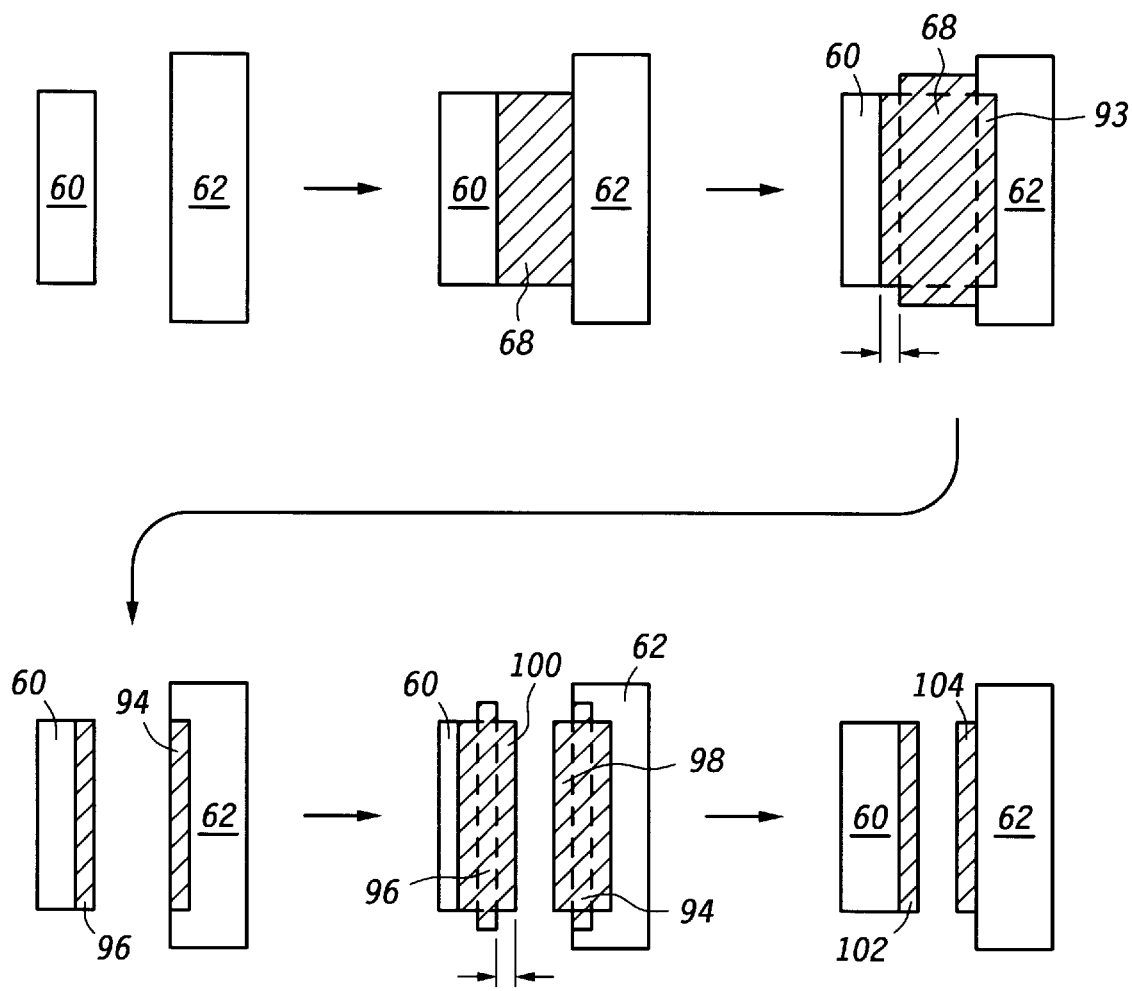

FIG. 11 is a flow chart that illustrates a method for generating edge bias shapes in accordance with another embodiment of the present invention. FIG. 12 is a portion of a circuit layout that illustrates the method of FIG. 11. Referring to both FIG. 11 and FIG. 12 and starting at step 80, a predetermined distance is used to select shapes to which bias correction is be applied. Next at step 82, a shape of the space between shapes 60 and 62 is determined. The space shape 68 between the shapes 60 and 62 can be generated using, for example, the method described above in the discussion of steps 50 and 52 of FIG. 10. Continuing at step 84, edges of space shape 68 are grown by a predetermined amount to create grown space shape 93. This can be done using the "edge out" shape function described in steps 24 and 26 of FIG. 5 above. Next at step 86, original design shapes 60 and 62 are intersected with grown space shape 93 to create edge areas 94 and 96. Continuing at step 88, the edges of edge areas 94 and 96 are extended out by a predetermined amount to provide grown edge areas 100 and 98, again by use of the "edge out" function described above. The predetermined amount that edge areas 94 and 96 are grown is equal to the amount of bias required. Next at step 90, space shape 68 is intersected with grown edge areas 98 and 100 to provide the edge bias shapes 102 and 104. Finally at step 92, the edge biased shapes 102 and 104 are unioned with original design shapes 60 and 62. When printed only the original design shapes 60 and 62 are formed.

By correcting layout shapes as discussed above, across chip line width variation (ACLV) is reduced. Also, the $L_{eff}$ (effective gate length of a MOS transistor) distribution is reduced. By compressing the distribution the threshold for maximum device speed ($F_{max}$) can be increased. Additionally, the lithographic processing latitude can be improved.

Figure 13:
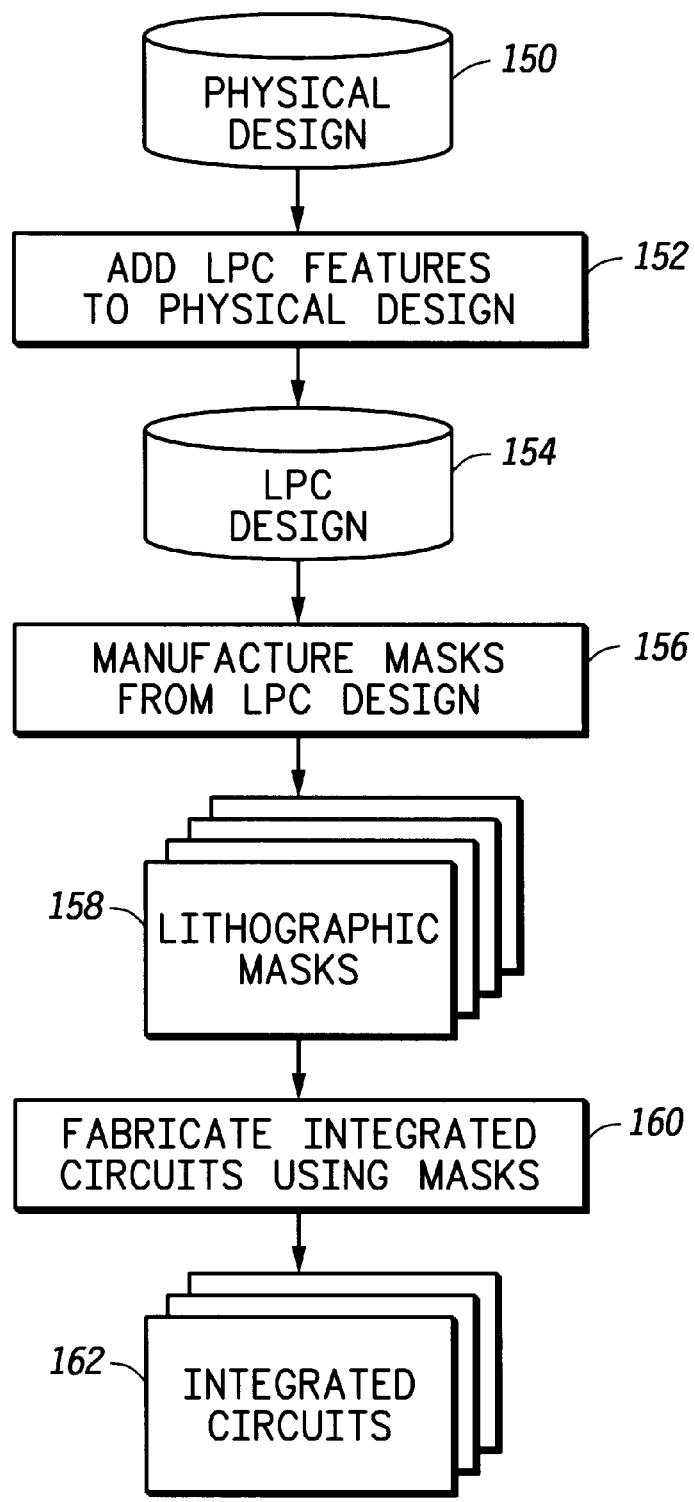
FIG. 13 is a block diagram that illustrates integrated circuit fabrication utilizing the LPC techniques disclosed herein.

FIG. 13 is a block diagram that illustrates integrated circuit fabrication utilizing the LPC techniques disclosed herein. Integrated circuit design today primarily utilizes Computer Aided Design (CAD) tools to design integrated circuits. These IC design CAD tools generate semiconductor physical design files 150. Semiconductor physical design files 150 include integrated circuit dimensions, element dimensions, and element locations within an integrated circuit. The physical design files 150 locate elements and connections within a two-dimensional substrate area of an integrated circuit die. Preferably, the physical design files 150 include physical structures for performing the functions of an integrated circuit design from which the physical design file was derived. LPC features are added 152 to the base shapes in the physical design file 150 using the techniques disclosed herein, resulting in the creation of LPC design files 154. The LPC design files 154 are then converted 156 into a set of lithographic masks 158 corresponding to the layers in the physical design file 150 and LPC design files 154. The lithographic masks 158 are used to fabricate 160 integrated circuits 162 using well know techniques.

Integrated circuit design resulting in the creation of physical design files 150 is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era, Volume* 1: *Process Technology*", by Wolf and Tauber, copyright 1986, published by Lattice Press. Process integration is taught by the second book in the series: "*Silicon Processing for the VLSI Era, Volume* 2: *Process Integration*", by Wolf, copyright 1990, published by Lattice Press.

Figure 14:
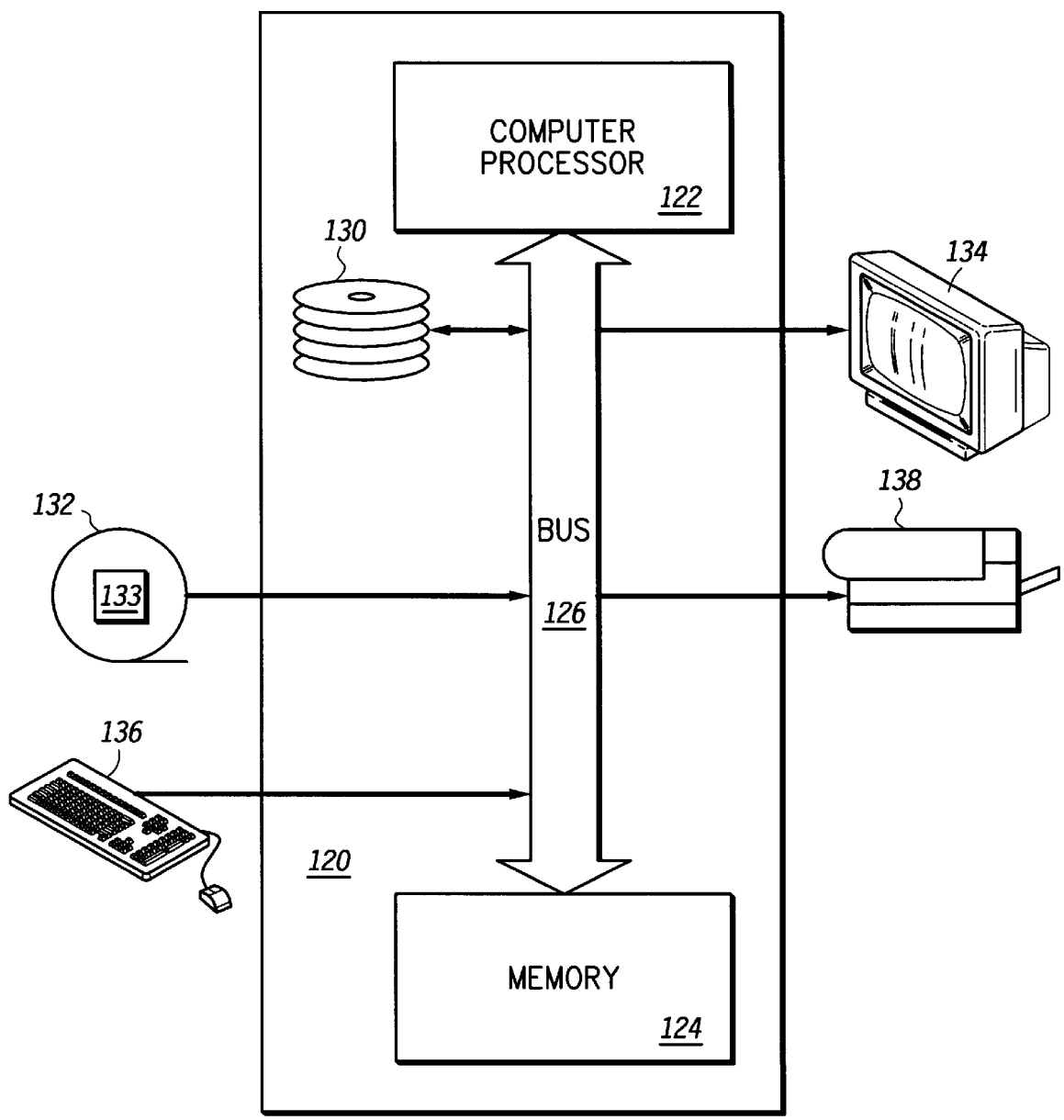
FIG. 14 is a block diagram showing a General Purpose Computer.

As illustrated in FIG. 14, the various methods discussed above may be implemented within dedicated hardware, or within processes implemented within a General Purpose Computer 120. The General Purpose Computer 120 has a Computer Processor 122, and Memory 124, connected by a Bus 126. Memory 124 includes relatively high speed machine readable media such as DRAM, SRAM, ROM, FLASH, EEPROM, and bubble memory. Also connected to the Bus are Secondary Storage 130, External Storage 132, output devices such as a monitor 134, input devices such as a keyboard (with mouse) 136, and printers 138. Secondary Storage 130 includes computer readable media such as hard disk drives, magnetic drum, and bubble memory. External Storage 132 includes computer readable media such as floppy disks, removable hard drives, magnetic tape, CD-ROM, and even other computers, possibly connected via a communications line. The distinction drawn here between Secondary Storage 130 and External Storage 132 is primarily for convenience in describing the invention. As such, it should be appreciated that there is substantial functional overlap between these elements. Executable versions of computer software 133, such as the LPC software utilized to implement the techniques disclosed herein and user programs are typically read from the External Storage 132 and loaded for execution directly into the Memory 124, or stored on the Secondary Storage 130 prior to loading into Memory 124 and execution. The physical design files 150 and LPC design files 154 utilized to make lithographic reticules are stored on either Secondary Storage 130 or External Storage 132.

Those skilled in the art will recognize that modifications and variations can be made without departing from the spirit of the invention. For instance, this includes implementing the invention for any semiconductor masked lithography process such as deep ultra-violet light, X-ray, ion-beam, extreme ultra-violet light (EUV), and electron-beam (E-beam) lithography. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

We claim:

1. A method for adding subresolution assist features to a semiconductor design to correct for proximity effects in the semiconductor design comprising the steps of:

A) performing a growing function on a base shape by a first amount to produce a first shape;

B) performing the growing function on the base shape by a second amount to produce a second shape;

C) subtracting the second shape from the first shape to produce the subresolution assist features; and D) unioning the base shape and the subresolution assist features to form a final shape, wherein the final shape including the subresolution assist features formed adjacent to the base shape.

2. The method in claim 1 wherein within steps (A) and (B):

the growing function is an edge-out function that moves each edge of the base shape outward a fixed amount in a direction such that it remains parallel to each original edge of the base shape.

3. The method in claim 1 wherein within steps (A) and (B):

the growing function is an expansion function that moves vertices of the base shape outward a fixed amount along all lines bisecting each original vertice of the base shape.

4. A method of producing a lithographic reticle utilizing the method in claim 1 which further comprises:

forming reflecting or opaquing bodies on the lithographic reticle corresponding to the altered semiconductor design.

5. A method of fabricating a semiconductor device utilizing the method in claim 1 which further comprises:

using a lithographic reticle corresponding to the altered semiconductor design to create a pattern on a semiconductor device.

6. A method of fabricating integrated circuits utilizing the method in claim 1 which further comprises:

E) generating an altered semiconductor design file containing the final shape;

F) creating a set of one or more lithographic masks from the altered semiconductor design file; and G) fabricating a plurality of integrated circuits from the set of one or more lithographic masks.

7. A method of applying edge biasing correction to adjacent features of a semiconductor design to compensate for proximity effects to form an altered semiconductor design, comprising the steps of:

A) defining a maximum distance separating a plurality of original design shapes for applying an edge biasing correction to the original design shapes;

B) producing a space shape comprising a space between the plurality of original design shapes that falls below the maximum separating distance, wherein the space shape is produced by growing the plurality of original design shapes by half of the maximum separating distance to form a first grown shape, shrinking the first grown shape by half of the maximum separating distance to form a second grown shape, and subtracting the plurality of original design shapes from the second grown shape to form the space shape;

C) performing a grow function on all edges of the plurality of original design shapes by a predetermined amount to produce an oversize shape;

D) intersecting the space shape with the oversize shape to produce a biasing shape, the biasing shape produced between the original design shapes; and E) unioning the plurality of original design shapes with the biasing shape to form a final shape.

8. A method of producing a lithographic reticle utilizing the method in claim 7 which further comprises:

forming reflecting or opaquing bodies on the lithographic reticle corresponding to the altered semiconductor design.

9. A method of fabricating a semiconductor device utilizing the method in claim 7 which further comprises:

using a lithographic reticle corresponding to the altered semiconductor design to create a pattern on a semiconductor device.

10. A method of fabricating integrated circuits utilizing the method in claim 7 which further comprises:

E) generating an altered semiconductor design file containing the final shape;

F) creating a set of one or more lithographic masks from the altered semiconductor design file; and G) fabricating a plurality of integrated circuits from the set of one or more lithographic masks.

11. A method of applying edge biasing correction to a semiconductor design to compensate for proximity effects to form an altered semiconductor design, comprising the steps of:

A) defining a maximum distance separating a plurality of base shapes for applying the edge biasing correction;

B) producing a space shape comprising a space between the plurality of base shapes that falls below the maximum separating distance;

C) growing each edge of the space shape by a predetermined amount to create a grown space shape;

D) intersecting the plurality of base shapes with the grown space shape to create an edge shape;

E) growing each edge of the edge shape by a predetermined amount to create a grown edge shape;

F) intersecting the space shape with the grown edge shape to provide a bias shape; and G) unioning the bias shape with the plurality of base shapes to form a final shape.

12. The method in claim 11 wherein step (B) comprises the substeps of:

1) growing the plurality of original design shapes by half of the maximum separating distance to form a first grown shape;

2) shrinking the first grown shape by half of the maximum separating distince to form a second grown shape; and 3) subtracting the plurality of original design shapes from the second grown shape to form the space shape.

13. A method of producing a lithographic reticle utilizing the method in claim 11 which further comprises:

forming reflecting or opaquing bodies on the lithographic reticle corresponding to the altered semiconductor design.

14. A method of fabricating a semiconductor device utilizing the method in claim 11 which further comprises:

using a lithographic reticle corresponding to the altered semiconductor design to create a pattern on a semiconductor device.

* * * * *